US006700980B1

(12) United States Patent
Hämäläinen et al.

(10) Patent No.: US 6,700,980 B1
(45) Date of Patent: Mar. 2, 2004

(54) METHOD AND DEVICE FOR SYNTHESIZING A VIRTUAL SOUND SOURCE

(75) Inventors: Matti Sakari Hämäläinen, Tampere (FI); Jukka Holm, Tampere (FI)

(73) Assignee: Nokia Display Products Oy (FI)

( * ) Notice: Subject to any disclaimer, the term of this patent is extended or adjusted under 35 U.S.C. 154(b) by 0 days.

(21) Appl. No.: 09/305,556

(22) Filed: May 5, 1999

(30) Foreign Application Priority Data

May 7, 1998 (FI) ................................................ 981014

(51) Int. Cl.[7] ............................ H04R 5/00; H03G 3/00

(52) U.S. Cl. ............................... 381/17; 381/1; 381/61

(58) Field of Search ........................... 381/1, 2, 11, 12, 381/17

(56) References Cited

U.S. PATENT DOCUMENTS 5,822,437 A * 10/1998 Winterer ........................ 381/1

* cited by examiner

*Primary Examiner*—Forester W. Isen
*Assistant Examiner*—Elizabeth McChesney
(74) *Attorney, Agent, or Firm*—Ware, Fressola, Van Der Sluys & Adolphson LLP

(57) ABSTRACT

The invention relates to a method for synthesizing a virtual sound source in a system (40) which comprises at least a right and a left channel for transmitting a stereo signal and in which the channels are connected to a filter block (42) for expanding the sound image. In the method, the amplifications of the separated monophonic and stereophonic signal components are optimized according to the stereophony of the signal coming to the system. The method according to the invention can also be applied to producing early room reflections by means of a separate filter block (71). The invention also relates to a device for synthesizing a virtual sound source, which device comprises at least a first and a second channel for transmitting the signal, at least one amplifier and filter and means for estimating the stereophony of the signal, for determining the amplification coefficient of the filtered signal and for controlling the amplifier according to the calculated amplification coefficient.

17 Claims, 5 Drawing Sheets

METHOD AND DEVICE FOR SYNTHESIZING A VIRTUAL SOUND SOURCE

BACKGROUND OF THE INVENTION

1. Technical Field

The invention relates to a device and method for synthesizing a virtual sound source.

2. Discussion of Related Art

In stereophonic sound reproduction, the objective is to transmit a realistic sound image to the listener by means of two sound channels. In conventional stereo reproduction, the direction of incidence of the sound is determined by the amplitude and phase ratios of the sound signal on different channels. Thereby the direction perceived by the listener as the direction from which the sound is coming, is always in the area between the loudspeakers or in the direction of either of the loudspeakers.

The conventional stereo effect achieved by two loudspeakers is limited, especially when the loudspeakers of the left and right channel are close to one another, as in a television set or a portable stereophonic radio cassette recorder, for example. When both loudspeakers are almost in the same direction with respect to the listener, there are no very distinct differences in the perceived sound direction.

The increase of multimedia applications that followed the growth of the computation capacity of personal computers has increased the need for a more advanced sound reproduction than the conventional stereo reproduction, which would be able to offer the listener a more realistic three-dimensional sound environment than before. A well known method to expand the capability of a sound reproduction system to represent sound direction is the use of several sound channels and loudspeakers, which is familiar from cinemas, for example.

Man perceives the direction of the incoming sound mainly by means of interaural time differences (ITD) and interaural level differences (ILD). In a two-channel sound reproduction system, it is in principle possible to simulate all the directions of the sound by changing the above mentioned factors. In this way, it is possible to create an impression that the sound comes from a direction outside the pair of loudspeakers.

In order to create the desired differences in the desired ITDs and ILDs of the sounds, so called HRTF (Head Related Transfer Function) filters are used in this method. HRTF filters mean transfer functions specified by measurement or calculation, which describe the filtering of a sound coming from a certain direction, mostly due to the effect of the shape of the head and external ear. By means of HRTF filters, it is possible to create an artificial sound image of a virtual sound source in stereophonic loudspeaker reproduction, if crosstalk from each loudspeaker to the opposite ear is taken into account in calculation.

FIG. 1 shows the known first filter system 10 for implementing a sound image based on at least one virtual sound source. The first filter system 10 consists of a first filter block 17, which contains four parallel filters 11, 12, 13 and 14, by means of which the signals Xl and Xr brought to the system are filtered in order to create a spatial effect, and two summing devices, 15 and 16. Both channels include two filters, one of which functions as a HRTF filter 11; 14, and the other as a crosstalk cancellation filter 12; 13.

If the sound sources are placed symmetrically around the listening position, a corresponding system can be implemented more efficiently by another filter arrangement 20 shown in FIG. 2. In this implementation, the filters 11, 12, 13 and 14 have been replaced by a first 24 and a second spatial filter 25, whereby the expansion can be implemented with only two filters. When the objective is to use a system in which the properties of the filters 24, 25 can be adjusted separately, the filters 24, 25 can be connected to a separate filter control circuit 28, by means of which the filtering of the signals can be changed in order to change the sound image.

A problem in the methods described above is constituted by the HRTF filters' complicated phase and frequency response properties. In stereophonic sound reproduction this is not a problem, because the desired spatial effect is achieved by these properties. If the signals being processed also contain monophonic signal components, the filters cause harmful distortions, because the hearing direction of the monophonic signal component need not be changed. In systems like this, the monophonic signal sounds colored. In principle, the distortion of the monophonic signal component could be corrected by adding one more filter stage to the system output, but this in turn would distort the desired spatial effect.

In this patent application, monophony means coherence between the signals of at least two channels. In a two-channel system, this means that coherence can be perceived in the signals of both channels. In a system with more channels, the monophony must be defined separately for each channel pair. Thus it is possible that the sound image contains multiple monophonic signals simultaneously.

Correspondingly, the stereophony of a signal means the portion of a signal of at least two channels between which there is no coherence. According to the above definition, it is possible that the signal consists partly of a monophonic and partly of a stereophonic signal.

FIG. 3 depicts a third filter arrangement 30 according to the patent application FI 962181, in which a third filter 31 has been added to the second filter block 21 according to FIG. 2, the delay properties of which filter correspond to the spatial filters 24 and 25. The second filter block 21, the third filter 31 added to it and the summing devices 36 and 37 together constitute the third filter block 34. In the solution according to the reference publication, sum and difference signals are calculated from the signals coming to the system in the device 32. The strength of the sum signal received is changed with amplifiers 33. The signal after the amplifiers 33 is used as an approximation of the monophonic signal contained by the channels. This approximation of the monophonic signal is subtracted from the signals of both channels, whereby essentially only a stereophonic signal remains in each channel. After this, the stereophonic signal is led to the second filter block 21 in order to produce a spatial effect, and the monophonic signal is led via the third filter 31 past the second filter block 21 to be summed back to the signals coming from the outputs of the second filter block 21.

The solution according to the patent specification FI-962181 does not entirely eliminate the colorization of the monophonic signal. In addition, a preadjusted constant value is used in this solution to reinforce the sum signal that approximates to the monophonic signal, whereby it is assumed that the ratio of monophonic and stereophonic signals remains constant. In reality, the ratios between stereophonic and monophonic signal components can vary considerably in a typical music recording, for example, which in a system based on that solution causes incomplete filtering, which is perceived as discrepancies and errors in the sound image produced.

SUMMARY OF INVENTION

It is the objective of this invention to achieve a new method and device for synthesizing a virtual sound source, by which the problems of the prior art described above can be eliminated.

In a method according to a first aspect of the invention, a virtual sound source is synthesized in a system which includes at least a right and a left channel for transmitting signals, and a filter block containing at least one filter and amplifier, through which the signals are conducted, is connected to the channels.

According to the first aspect of the invention, the stereophony of the signals fed to the filter system is determined by means of a mono/stereo estimator. According to this estimation, amplification coefficients are specified for the signals received from each filter, on the basis of which coefficients the signals received from filters are amplified.

In one embodiment of the method according to the invention, the stereophony of the signal is determined on the basis of the symmetry of the cross-correlation between the channels by means of a certain decision function. The decision function used can be e.g. a piecewise continuous function, such as a step or ramp function. If the signal of one channel is significantly stronger than that of the other one, in one embodiment of the invention the signal can be defined as stereophonic regardless of the value of the decision function.

In another embodiment of the method according to the invention, the sum signal of the channels that approximates to the monophonic part of the signal is conducted through a separate filter.

In yet another embodiment of the method according to the invention, the virtual location of the monophonic virtual sound source is moved off the central axis of the pair of loudspeakers.

In still another embodiment of the method according to the invention, the signal is led from the filter block before the filters to a separate filter block in order to produce early virtual room reflections, whereafter the filtered signals are summed to the signals after the filters of the original filter block. The separate filter block can contain, for example, at least a delay circuit for producing a time difference to the early room reflection to be synthesized, an equalization filter for filtering the signal in the desired frequency band, and a spatial filter for producing a spatial effect. In addition, the intensity of the signal filtered in a separate filter block can be advantageously changed according to the reflection strength coefficients estimated in the mono/stereo estimator, for example.

The device according to the second aspect of the invention includes at least a right and a left channel, to which at least one filter and amplifier are connected.

The device according to the second aspect of the invention comprises means for determining the stereophony of the signal, means for specifying the amplification coefficient of a signal received from at least one amplifier, and means for controlling at least one amplifier in accordance with the specified amplification coefficient.

In one embodiment of the device according to the invention, at least some of the means are the same.

In another embodiment of the device according to the invention, the device comprises means for simulating early room reflections in the sound image.

The invention helps to achieve a better sound image compared to the prior art, when discrepancies and errors caused by a less than optimum amplification ratio can be eliminated in cases in which the ratios of monophonic and stereophonic signals vary.

In addition, the method provides a way of implementing early room reflections, which enables the creation of a more realistic spatial effect.

BRIEF DESCRIPTION OF THE DRAWINGS

In the following, the invention will be described in more detail with reference to the accompanying drawings, in which.

DETAILED DESCRIPTION OF PREFERRED EMBODIMENTS

Figure 1:
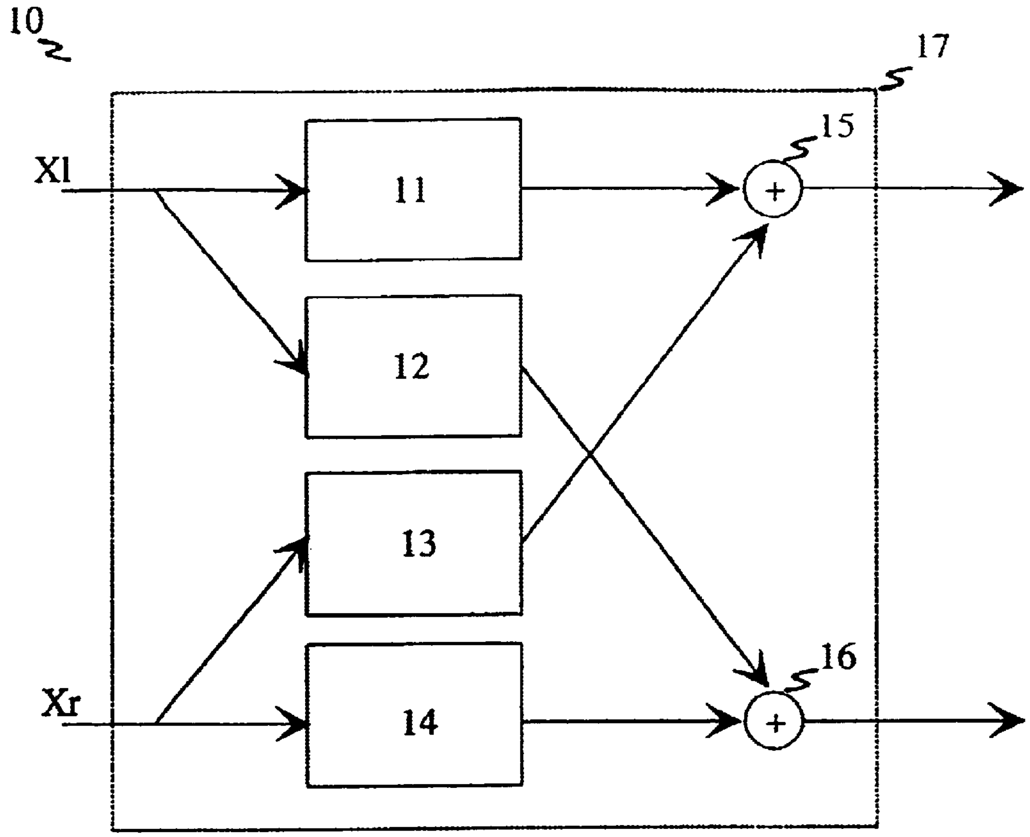
Prior Art Fig. 1
FIG. 1 shows a known filter system for synthesizing a virtual sound source.
Figure 2:
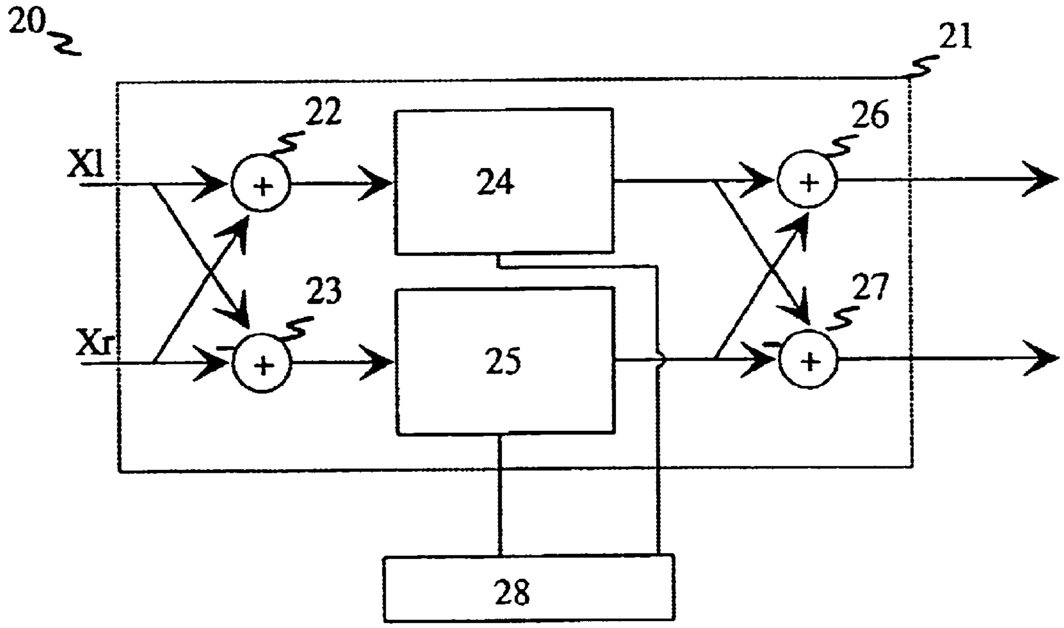
Prior Art Fig. 2
FIG. 2 shows another known filter system for synthesizing a virtual sound source.
Figure 3:
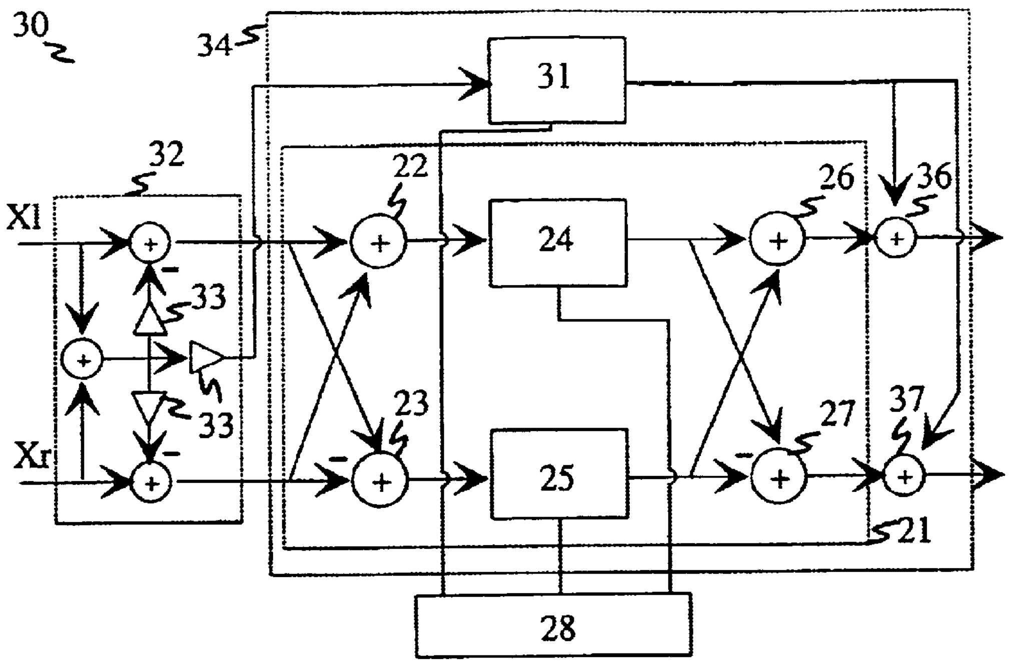
Prior Art Fig. 3
FIG. 3 shows a third known system for synthesizing a virtual sound source, in which system an attempt is made to separate monophonic and stereophonic signals.

FIGS. 1, 2 and 3 have been dealt with above in connection with the description of the prior art.

The same reference numbers and markings are used in the figures for corresponding parts.

Figure 4:
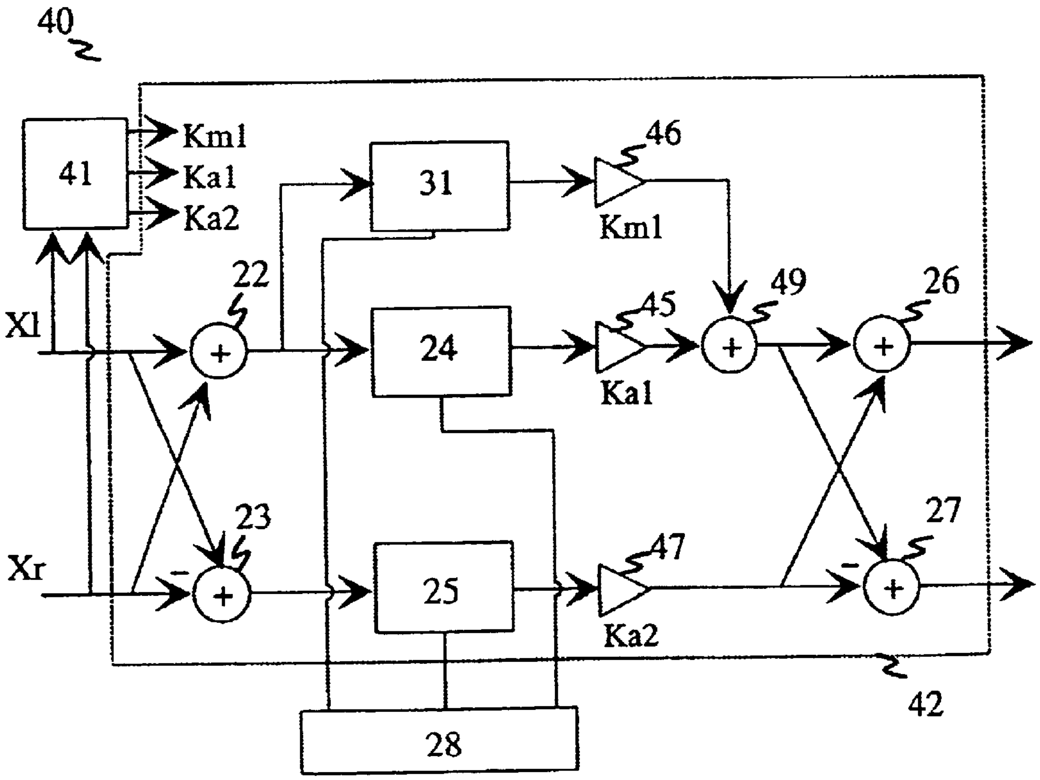
FIG. 4 shows an adaptive filter system according to the invention for synthesizing a virtual sound source.

FIG. 4 shows a fourth filtering arrangement 40 that enables the synthesizing of a virtual sound source according to the invention. The solution is based on the prior art third filter block 34 shown in FIG. 3, in which sum and difference signals are at first calculated from the channels Xl and Xr in the first and second summing device 22 and 23. After this, the sum signal is filtered in the first spatial filter 24 and the difference signal in the second spatial filter 25. After this, the filtered sum and difference signals received from the filters 24 and 25 are reconnected in the third and fourth summing device 26 and 27. In FIG. 4, the fourth filter block 42 delimited by a dashed line further comprises a third filter 31 like the one in the third filter block 34, connected in parallel with the first spatial filter 24, which third filter 31 preferably has identical delay properties with the first spatial filter 24. In addition to these, the fourth filter block 42 comprises a first amplifier 45 for changing the level of the signal coming from the first spatial filter 24, a second amplifier 47 for changing the strength of the signal coming from the second spatial filter 25, and a third amplifier 46 for amplifying the signal coming from the third filter 31, and a fifth summing device 49 for summing the signals received from the first amplifier 45 and the third amplifier 46.

The signal to be processed is brought to the fourth filter block 42 through two channels Xl and Xr. The channels are connected to a mono/stereo estimator 41 for determining the stereophony of the signal.

According to the prior art, the sum and difference signals of the input channels are at first formed in the first and second summing device 22 and 23 of the fourth filter block 42. The sum signal is led to the first spatial filter 24 and the third filter 31 connected in parallel. The difference signal is led to the second spatial filter 25. When it is desired that the properties of the filters 24, 25, 31 can be separately adjusted, the filters 24, 25, 31 can be connected to a separate filter control circuit 28.

According to the invention, the outputs of the filters 24, 25 and 31 are in a corresponding manner connected to the amplifiers 45, 47 and 46, the amplification coefficients of which ($K_{a1}$, $K_{a2}$, $K_{m1}$) are determined on the basis of the estimation carried out by the mono/stereo estimator 41. After the first 45 and third amplifier 46, the signals coming through the third filter 31 and the first spatial filter 24 are summed in the fifth summing device 49. In the end, the sum signal of the signals passed through the first spatial filter 24 and the third filter 31 and the difference signal that has come through the second spatial filter 25 are combined in the third 26 and fourth summing device 27.

With regard to the present invention it is essential that the mutual levels of the signals received from the filters 24, 25 and 31 are adjusted by modifying the amplification of the amplifiers 45, 47 and 46 according to the amplification coefficients received from the mono/stereo estimator 41 so that the mutual relations of the signals are preferably optimum for the sound image to be produced, regardless of the ratio of monophonic and stereophonic signals.

The adjustable amplifiers 45, 47 and 46 can also be placed before the filters, but then the calculation needed becomes more complicated, because the changes made on the amplification levels should also be made on the delay lines of the spatial filters, whereby the complexity of changing the amplification would be proportional to the length of the spatial filter. If the changes in the amplification were not also made on the delay lines of the spatial filters, the change of amplification could be perceived as errors in the sound image.

The mono/stereo estimator 41 determines different amplification coefficients by examining the stereophony of the signal coming to the system. The stereophony of the signal can be conveniently determined by utilizing the fact that the cross-correlation between the channels is symmetrical if the signal to be examined is monophonic. Thus the monophony of the signal to be examined can be determined by testing how symmetrical the cross-correlation between the channels is.

The monophony of the signal can be determined by the following formula, for example:

$$\overbrace{|r[n]l[n-1]-l[n]r[n-1]|}^{1}+\ldots+\overbrace{|r[n]l[n-N]-l[n]r[n-N]|}^{N}-c|r[n]l[n]| = \begin{cases} <0 = \text{monophonic} \\ >0 = \text{stereophonic} \end{cases}$$

where l[n] is the signal of the left channel and r[n] is the signal of the right channel at the instant of time n and c is constant. The equation consists of a chosen number of correlation terms (1 . . . N), in which the absolute value of the difference of the product of the signal in the right channel at the instant n and the earlier instant of the left channel (n−x, where x=1 . . . N) and the product of the signal in the left channel at the instant n and the earlier instant of the right channel (n−x, where x=1 . . . N) is calculated. The absolute value of the product of the signals of the channels at the instant n multiplied with the constant coefficient c is then subtracted from the sum of the cross-correlation terms. The constant coefficient c is used to define how high the proportion of the monophonic signal should be in order that the signal would be classified as monophonic. The higher the number of correlation terms or the higher the value of N is, the more accurately the stereophony of the signal can be determined.

If there is a previously known difference in the strength of the signals of the channels to be examined, e.g. when it is known that the signal of one channel is always a little stronger than the other one, it is possible to make a balance correction to the output signals by multiplying in the above equation the strength of one channel by such a constant that the known difference in strength is compensated.

Given the teachings hereof, it would be evident to a person skilled in the art that the method based on cross-correlation between the signals described above is not the only method for determining the monophony of a signal. The determination can also be carried out by other methods, such as methods based on a comparison of the amplitude or phase differences of signals between the channels.

Figure 5:
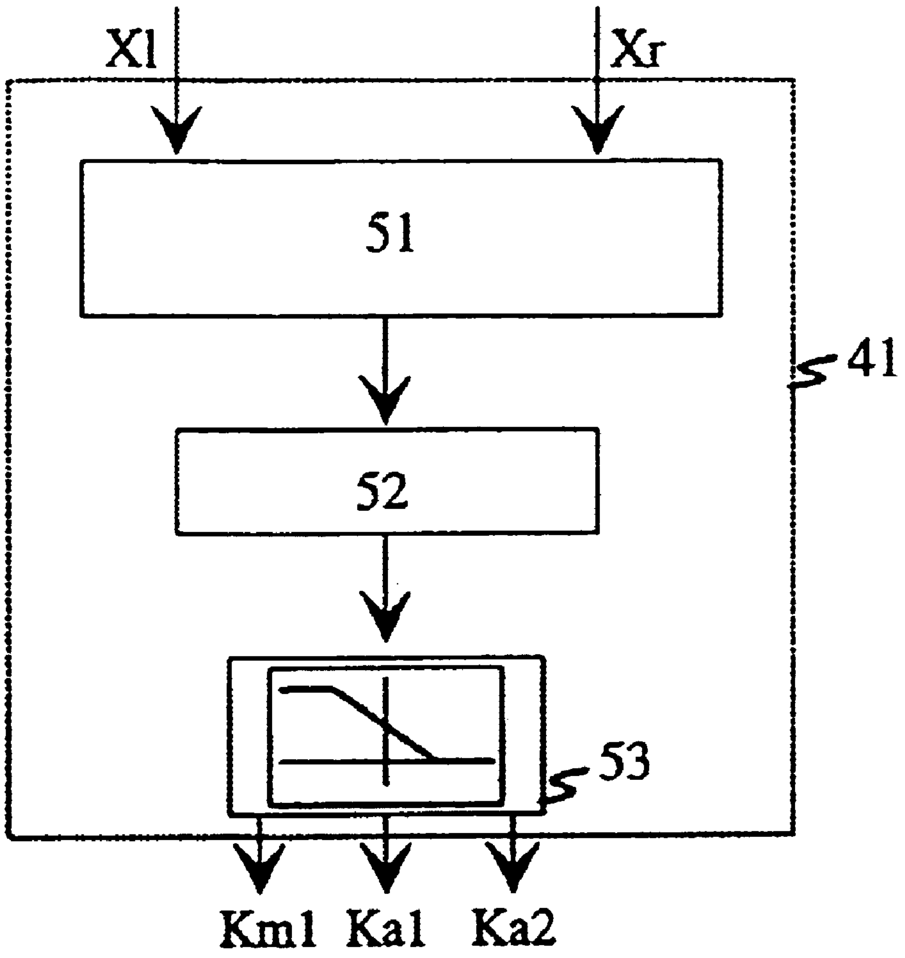
FIG. 5 shows a solution according to the invention for implementing a mono/stereo estimator.

FIG. 5 shows one solution for implementing the mono/stereo estimator, in which the correlation block 51 carries out a correlation determination according to the above formula. The signal received from the correlation block 51 can then be directed to the low-pass filtering block 52, which equalizes rapid changes of the correlation signal. By means of equalization filtering it is possible to regulate, in a known manner, how fast the mono/stereo estimator reacts to changes that take place in the stereophony of the signal being examined.

When the stereophony of the signal has been estimated by means of the above method, for example, the stereophony should be used as the basis for deciding the desired, preferably optimum amplification of each amplifier with the ratio of the mono/stereo signals in question. This can be determined by the decision function block 53 shown in FIG. 5, for example, to which the low-pass filtered correlation signal is directed.

Figure 6A:
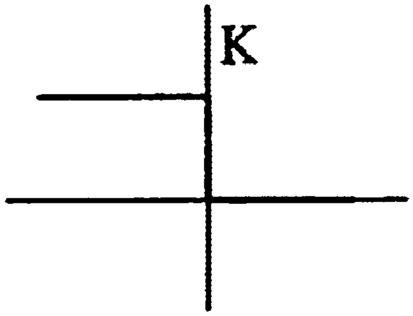
FIG. 6 shows two solutions according to the invention for the shape of the decision function of the mono/stereo estimator.
Figure 6B:
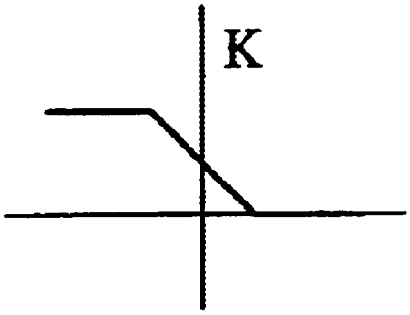

FIGS. 6*a* and 6*b* show graphically two examples of the form of the decision function to be used. In both figures, the value of the horizontal axis represents the stereophony of the signal, which may have been received by cross-correlation in the manner described above. The value of the Y axis represents the variable K, which can be used in the adjustment of adjustable amplifiers. The value of the variable K typically varies between two predetermined values, preferably between 0 and 1 so that when the value of K is 0 the signal is entirely monophonic, and when the value of K is 1 it is entirely stereophonic. The decision function used is preferably piecewise continuous, whereby all the values of stereophony can be used to define a value for the variable K.

FIG. 6*a* shows a stepped decision function, which defines the signal always as either entirely monophonic (K=0) or entirely stereophonic (K=1). A decision function according to FIG. 6*a* is useful when tuning the mono/stereo estimator, but due to the discontinuity of the function the sound image contains audible errors when the signal switches between the monophonic and stereophonic state.

A ramped decision function shown in FIG. 6*b* is more useful than a stepped function in typical applications of a virtual sound source. When a ramped decision function is used, the variable K can also receive values between the extreme alternatives, whereby the signal being examined is regarded as containing partly monophonic and partly stereophonic signal.

It will be clear to a person skilled in the art that the possible shapes of the decision function are not limited to the above examples only, but functions of different shapes can also be used as decision functions.

Depending on the stereophony estimation method used it is possible that in cases where one signal is remarkably stronger than the other one, as in cases where one channel has been muted, the algorithm used can erroneously interpret the signal as monophonic. This can be prevented by adding an extra test to the decision function, which test recognizes the signal as stereophonic if the strengths of signals in different channels are significantly different.

The value received from the decision function is then used to adjust the amplifications of the amplifiers 45, 46 and 47 shown in FIG. 4. The amplification coefficients can be determined as follows, for example:

$$K_{a1}=K^*c$$

$$K_{b1}=1$$

$$K_{m1}=1-K_{a1}$$

where $K_{a1}$ is the amplification coefficient of the first amplifier 45 after the first spatial filter 24, $K_{b1}$ is the amplification coefficient of the second amplifier 47 after the second spatial filter 25, and $K_{m1}$ is the amplification coefficient of the third amplifier 46 after the third filter 31. The constant coefficient c is used to restrict the amplification of the signal coming through the first spatial filter when the signal is entirely stereophonic (K=1).

One way of creating more realistic sound images is to add to the synthesized sound image of the virtual sound source information of the size and acoustic properties of the virtual space where the virtual sound source is situated. Information of the virtual space can be produced to the sound image by adding to it early and late room reflections and attenuation effects caused by the virtual space. It is a known method to model early room reflections by means of geometric acoustics, as well as it is a known method to use recursive filter structures for modelling attenuation caused by the virtual space.

Figure 7:
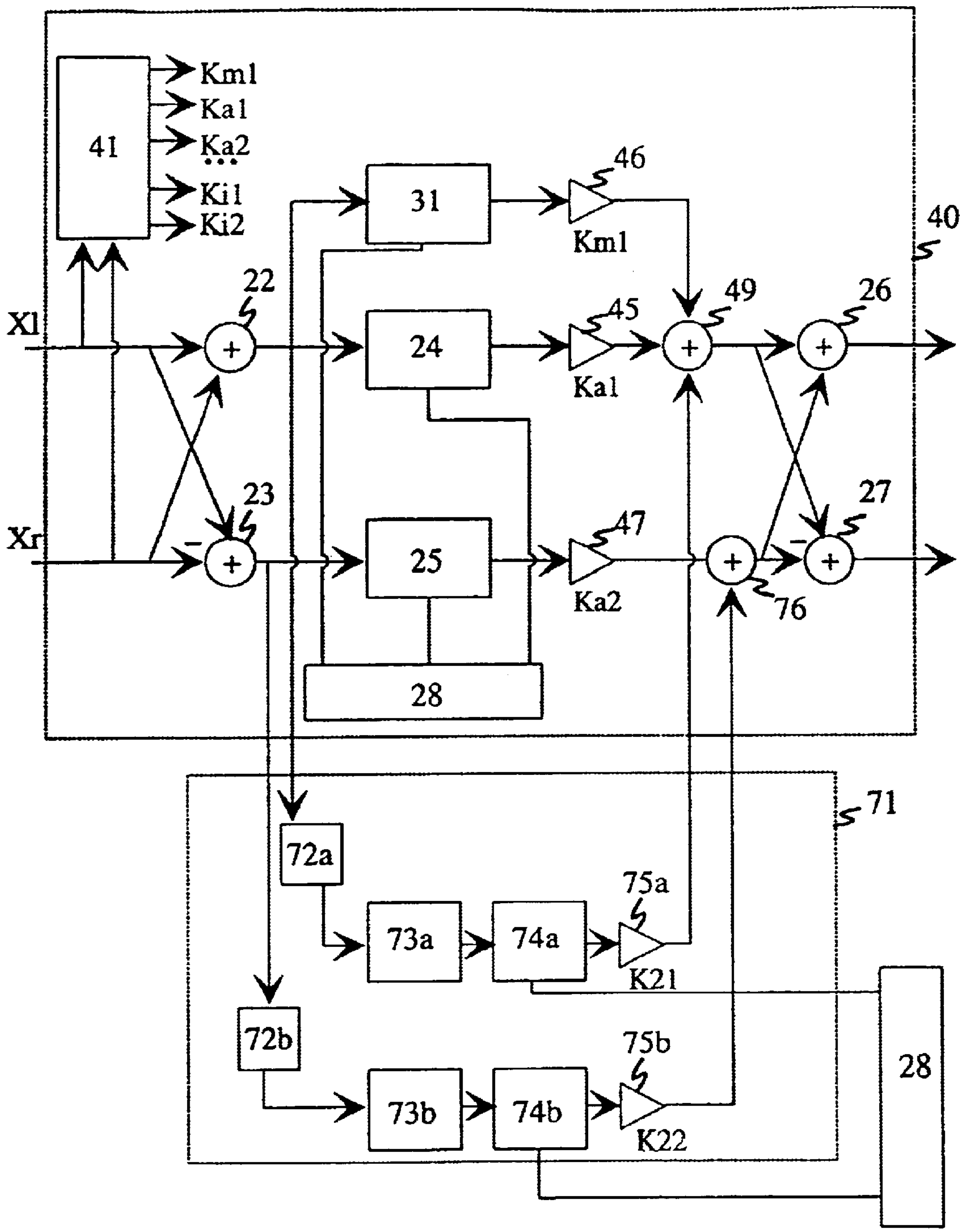
FIG. 7 shows a filter system according to the invention, which comprises at least one separate filter block for implementing early virtual room reflections.

FIG. 7 shows a solution based on the fourth filter arrangement 40 according to FIG. 4 for synthesizing virtual acoustic spaces. In FIG. 7, a separate filter block 71 has been added to the fourth filter arrangement 40 for synthesizing early room reflections. Within the limits of the calculation power available there may be even more blocks that produce separate reflections and other effects. In the following, the solution according to the invention will be described in more detail with reference to the use of one separate filter block 71 shown in FIG. 7. If there are more separate filter blocks, their operation is arranged correspondingly.

When a fourth filter arrangement 40 as in FIG. 4 is used, the sum and difference signals received from the first and second summing element 22 and 23 are led to a separate filter block 71 for synthesizing early room reflections. The filter block 71 used for calculating the early room reflections preferably comprises for both the sum and difference signal at least one delay circuit 72a; 72*b*, an equalization filter 73*a*; 73*b*, a spatial filter 74*a*; 74*b* and an amplifier 75*a*; 75*b*. The delay circuits 72*a* and 72*b* cause a delay in the early room reflection which corresponds to the temporal difference between the sound coming directly from the virtual source and the reflected sound. The equalization filters 73*a* and 73*b* model the attenuation of high frequencies that take place in the air and in connection with the reflection. The spatial filters 74*a* and 74*b* create a similar three-dimensional sound image for the early room reflection as the spatial filters 24 and 31. The adjustable amplifiers 75*a* and 75*b* are used to adjust the strength of the reflected signals to comply with the reflection strengths $K_{21}$ and $K_{22}$. The calculation of reflection strengths is a technique known as such, which can be implemented, for example, by adding to the mono/stereo estimator 41 means that are necessary for calculating the reflection strengths $K_{21}$ and $K_{22}$.

In the fourth filter arrangement 40, the sum and difference signals received from the separate filter block 71, which represent the early room reflections, are summed in the fifth summing device 49 and in a sixth summing device 76 back to the corresponding sum and difference signals after the filters 24, 25, 31.

Solutions according to the invention are not limited to the solutions represented by the above examples only, but the solutions can vary within the limits defined by the claims. In particular, the solution according to the invention is not limited to the filter arrangement 20 shown in FIG. 2, but the solution according to the invention can also be applied in other kinds of filter arrangements, as shown, for example, in FIG. 8.

Figure 8:
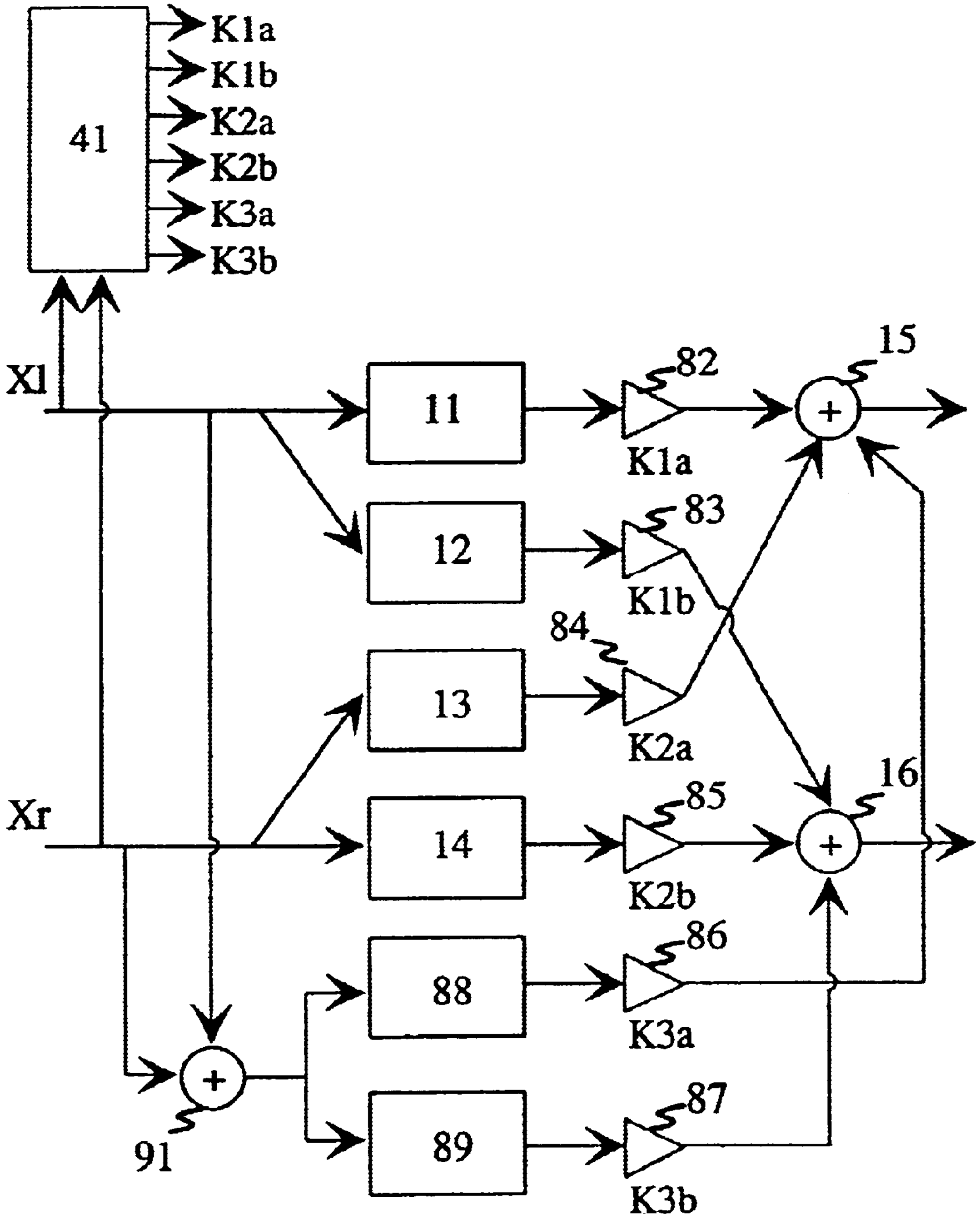
FIG. 8 shows a solution according to the invention for synthesizing a virtual sound source.

FIG. 8 shows a solution according to the invention for synthesizing a virtual sound source in a filter system based on the first filter arrangement 10 shown in FIG. 1. In order to clarify FIG. 8, the control circuit 28 that can be included in the arrangement for controlling the filters and the connections related to it have not been drawn in the figure. In the solution, the stereophony of the signal is examined by means of the mono/stereo estimator 41, by means of which the amplification coefficients are specified for the amplifiers 82, 83, 84, 85, 86 and 87 after the filters 11, 12, 13, 14, 88 and 89. Before the filters, part of the signals in both channels is led to the summing device 91 for producing a sum signal approximating to signal monophony.

The sum signal is divided for the fifth 88 and sixth 89 filter for implementing the desired filtering for the monophonic signal. After the filtering, the signal coming from the fifth filter 88 is led to the fifth amplifier 86, which adjusts the strength of the monophonic signal to be fed to the left channel according to the amplification coefficient $K_{3a}$ received from the mono/stereo estimator 41. Correspondingly, the sixth filter 89 and the sixth amplifier 87 process the monophonic signal to be fed to the right channel according to the amplification coefficient $K_{3b}$ received from the mono/stereo estimator 41. After this, the monophonic signals received are summed in the summing devices 15 and 16 to the corresponding channels going to the sound sources.

The stereo expansion filter 11 of the left channel creates the desired spatial effect in the signal of the left channel, and the crosstalk cancellation filter 12 of the left channel controls the audibility of the left channel signal from the right channel. Correspondingly, the HRTF filter 14 creates the desired spatial effect in the signal of the right channel, and the crosstalk cancellation filter 12 controls the audibility of the right channel signal from the left channel. According to the invention, amplifiers 82, 83, 84 and 85 are placed after all the filters presented, by means of which amplifiers the strength of the signal received from each filter is adjusted according to the amplification coefficients $K_{1a}$, $K_{1b}$, $K_{2a}$ and $K_{2b}$ received from the mono/stereo estimator. When the signal strengths have been adjusted, the signal received from the amplifier 82 after the stereo expansion filter 11 of the left channel is summed in the summing device 15 of the left channel with the signal received from the amplifier 84 after the crosstalk cancellation filter 13 of the right channel. Correspondingly, the signal received from the amplifier 85 after the HRTF filter 14 of the right channel is summed in the summing device 16 of the right channel with the signal received from the amplifier 83 after the crosstalk cancellation filter 12 of the left channel.

Compared to the fourth filter arrangement 40 shown in FIG. 4, the solution shown in FIG. 8 has the advantage that the sound image need not be limited to sound sources placed symmetrically around the listening position.

By the embodiment shown in FIG. 8, it is possible to implement a solution in which the monophonic sound image need not necessarily be heard from the midpoint of the sound sources, as in the solution of FIG. 4. By means of a sound image created by the solution represented by FIG. 8, a monophonic signal can be made to be heard from any chosen direction between the sound sources. In other words, the position of the monophonic virtual sound source is moved to a location, where the distances to the loudspeakers of the pair of loudspeakers producing the sound are different from each other.

In view of the foregoing description it will be evident to a person skilled in the art that various modifications may be made within the scope of the invention. While a preferred embodiment of the invention has been described in detail, it should be apparent that many modifications and variations thereto are possible, all of which fall within the true spirit and scope of the invention.

What is claimed is:

1. A method for synthesizing a virtual sound source in a system, which comprises at least a right and a left channel for transmission of a signal and in which at least one filter and amplifier is connected to the channels, comprising steps in which the degree of stereophony of the signal is estimated by means of a mono/stereo estimator, and the amplification coefficients of signals produced by said at least one filter are determined on the basis of said estimation, and the level of the signals produced by said at least one filter is changed before the filter according to said determined amplification coefficients, and the stereophony of the signal is estimated on the basis of the symmetry of the cross-correlation between the channels by means of a certain decision function.

2. A method according to claim 1, wherein the change of level of said signals produced by said at least one filter is effected before the filters according to said determined amplification coefficients.

3. A method according to claim 1 wherein the signal is defined as stereophonic regardless of the decision function if the signal of one channel is significantly stronger than that of the other one.

4. A method according to claim 1 wherein said decision function is piecewise continuous.

5. A method according to claim 4 wherein said decision function is a step function.

6. A method according to claim 4 wherein said decision function is a ramp function.

7. A method for synthesizing a virtual sound source in a system, which comprises at least a right and a left channel for transmission of a signal and in which at least one filter and amplifier is connected to the channels, comprising steps in which the degree of stereophony of the signal is estimated by means of a mono/stereo estimator, and the amplification coefficients of signals produced by said at least one filter are determined on the basis of said estimation, and the level of the signals produced by said at least one filter is changed according to said determined amplification coefficients, and further a monophonic signal is led along a separate channel past at least a first spatial filter.

8. A method according to claim 7 wherein the stereophony of the signal is estimated on the basis of the symmetry of the cross-correlation between the channels by means of a certain decision function.

9. A method for synthesizing a virtual sound source in a system, which comprises at least a right and a left channel for transmission of a signal and in which at least one filter and amplifier is connected to the channels, comprising steps in which the degree of stereophony of the signal is estimated by means of a mono/stereo estimator, and the amplification coefficients of signals produced by said at least one filter are determined on the basis of said estimation, and the level of the signals produced by said at least one filter is changed according to said determined amplification coefficients, and further position of the monophonic virtual sound source is moved to a location, where the distances to the loudspeakers of the pair of loudspeakers producing the sound are different from each other.

10. A method for synthesizing a virtual sound source in a system, which comprises at least a right and a left channel for transmission of a signal and in which at least one filter and amplifier is connected to the channels, comprising steps in which the degree of stereophony of the signal is estimated by means of a mono/stereo estimator, and the amplification coefficients of signals produced by said at least one filter are determined on the basis of said estimation, and the level of the signals produced by said at least one filter is changed according to said determined amplification coefficients, and further a signal of at least one of the channels is led before said at least one filter to at least one separate filtering block for synthesizing early virtual room reflections and for creating a processed signal, whereafter said processed signal is summed back to the signal of the same channel after said at least one filter.

11. A method according to claim 10 wherein said signal is led through at least an equalization filter in said separate filtering block for adjusting the signal level in certain frequency ranges.

12. A method according to claim 10 wherein said signal is led through at least a spatial filter in said separate filtering block for achieving a spatial effect.

13. A method according to claim 10 wherein the level of said signal is changed after the filtering in said separate filtering block according to reflection strength values.

14. A method according to claim 13 wherein the reflection strength values are calculated in the mono/stereo estimator.

15. A method according to claim 10 wherein said signal is led through at least a delay circuit in said separate filtering block.

16. A device for synthesizing a virtual sound source, in which device there is at least a right and a left channel for transmitting the signal, and at least one filter and at least one amplifier is connected to the channels, comprising means for estimating the stereophony of the signal, means for determining an amplification coefficient of a signal received from said at least one amplifier, and means for controlling the amplifier according to said amplification coefficient, wherein at least two of said means are the same means.

17. A device according to claim 16 comprising means for synthesizing early room reflections.

* * * * *